P-N JUNCTION TYPE LIGHT-EMITTING SEMICONDUCTOR

Filed Feb. 26, 1968

INVENTORS
HIROO YONEZU
AKIRA KAWAJI
BY
Hopgood & Calimafde
ATTORNEYS 3,501,679

P-N JUNCTION TYPE LIGHT-EMITTING SEMICONDUCTOR

Hiroo Yonezu and Akira Kawaji, Tokyo-to, Japan, assignors to Nippon Electric Company, Limited, Tokyo-to, Japan Filed Feb. 26, 1968, Ser. No. 708,399
Claims priority, application Japan, Feb. 27, 1967, 42/12,769
Int. Cl. H01l *5/02,* H01s *3/18*
U.S. Cl. 317—234 3 Claims

ABSTRACT OF THE DISCLOSURE

A p-n junction type semiconductor light-emitting element is disclosed, such as a p-n junction type semiconductor laser, comprising a crystal having p-p$^+$-n regions in which the thickness of the p$^+$ region from the p-n junction is not greater than the diffusion length of the carrier electron.

The present invention relates to a p-n junction type semiconductor light-emitting element and particularly to a p-n junction type semiconductor laser, having a specific concentration distribution.

In a semiconductor light-emitting element including a laser of this p-n junction type, recombination radiation of carriers occurs in the vicinity of the junction and the light is emitted outside through n-type or p-type conductivity layer, when an electric current is passed through the aforementioned p-n junction in the forward direction. In case of a gallium arsenide p-n junction laser which has been most widely used in this field, the light is emitted along the p-type conductivity layer in the vicinity of the junction in the direction parallel to the junction. The emitted light undergoes absorption by the bulk material of the element, and the degree of this absorption varies with difference in the conductivity types (p-type or n-type) as well as with the concentration of impurities in each layer. The absorption of this kind is particularly remarkable in the vicinity of the energy gap. On the other hand, the wavelength of light emitted from the light-emitting element corresponds almost to the energy in the vicinity of the energy gap. As impurities are increased, the energy gap becomes obscure and the state density is prolonged in the energy gap, so that the so-called exponential tail is produced. In case of gallium arsenide. the p-type absorbs much light of wavelength corresponding to the energy in the vicinity of the energy gap as compared with the n-type, where the p- and n-types have the same concentration of impurities. These facts are described in, for example, "Physical Review," vol. 133, No. 3A (1964) pp. A866–A872. According to a measurement at 77° K., change of state density at the end of the exponential tail becomes remarkable, when the impurity concentration exceeds $7\times10^{18}$ cm.$^{-3}$ in case of p-type and exceeds $5\times10^{18}$ cm.$^{-3}$ in case of n-type. Naturally, the higher the impurity concentration becomes, the more the light is absorbed which corresponds to the energy in the vicinity of the energy gap. In a semiconductor laser, coherent waves are generated along the p-type region in the vicinity of the p-n junction, but the light penetrates into a much wider region and is subjected to absorption in that region, with the result of inevitable loss of the light. Where a light-emitting diode is combined with a light-receiving diode, utilized is the light passing through the n-type layer, even though the n-type layer is thicker than the p-type layer, because the light is more absorbed in the p-type layer. On the other hand, since the light is generated in the p-type region in the vicinity of the junction, more light is emitted as the impurity concentration in the p-type region is increased and further as the impurity concentration in the n-type region is increased for improving the electron injection efficiency. Especially at room temperature, the light emission from the gallium arsenide light-emitting diode becomes weak unless the impurity concentration in the p-type layer is large, so that it is desired to enhance the light-emitting efficiency by increasing the impurity concentration. However, the absorption loss will increase markedly as the impurity concentration increases. As described above, enhancement of the light-emitting efficiency is necessarily accompanied with the increase of loss, in the conventional semiconductor light-emitting element including the laser.

The object of the present invention is to provide a light-emitting element which has high light-emitting efficiency and low absorption loss.

The light-emitting semiconductor device of this invention comprises a semiconductor crystal of direct-transition type having a region of one conductivity type and a region of the opposite type conductivity to said one conductivity type separated from the one conductivity type region by a p-n junction. The recombination radiation of carrier occurs in the one conductivity type region in the vicinity of the junction with a forward bias being applied across the junction, and is characterized in that in the one conductivity type region a layer of the same conductivity type but of a higher impurity concentration is formed adjacent to the p-n junction and within the extent of diffusion length of the carirers injected from the p-n junction.

Where the semiconductor crystal is gallium arsenide, it is in the p-type region that recombination radiation occurs. It follows that the carrier is an electron which is injected from the p-n junction into the p-type region to cause recombination radiation. The diffusion length of the electron in gallium arsenide ranges approximately 1 micron to 3 microns at a temperature of 77° K. to room temperature and for impurity concentration of about $10^{18}$ to $10^{19}$ cm.$^{-3}$ and typically is approx. 1 micron to 1.5 micron at a temperature near 77° K. and for the impurity concentration described. In case of gallium phosphide, diffusion length of electron is typically 4 to 5 microns. The diffusion length of a carrier depends, in a very complicated manner, on various factors such as temperature and impurity concentration and hence is determined in many cases by an experimental measurement. In case of a semiconductor laser using the crystal of gallium arsenide, indium arsenide, indium antimonide (InSb), gallium phosphide, or the like, in which recombination radiation occurs in a p-type region, the crystal thus has the p-p$^+$-n regions according to this invention in which the thickness of the p$^+$ region from the p-n junction is within the diffusion length of the carrier electron. In the crystal of the kind that recombination radiation occurs in an n-type region, the carrier is naturally a hole.

Since the thickness of the high concentration layer formed adjacent to the p–n junction is not more than the diffusion length of the carrier, the recombination due to the carrier injected from the junction occurs mostly in this layer. In the high concentration layer, the state density exists within the energy gap, so that the wavelength of the emitted light becomes long, that is, the light quantum energy is small. On the other hand, in the regions sandwiching this high concentration light-emitting layer, the state density existing in the energy gap becomes small and the generated light is less absorbed, because of the relatively low impurity concentration. Therefore, the light generated in the high concentration layer, though it penetrates into the surrounding regions, is able to go outside almost without being absorbed by the surrounding regions. In the high concentration layer, the light emission efficiency is higher because of its great impurity concentration. Thus, both the strong light emission in the high concentration layer and the less light absorption in the other regions permit the light to be emitted outside efficiently.

Here, the thickness of the high concentration layer means the effective thickness thereof to be mentioned hereinafter. As for the thickness of the high concentration layer, the thickness equal to the diffusion length of the carrier in that layer is most preferable and also defines the upper limit of the effective range of the thickness. Thickness more than the diffusion length results a great increase in absorption of the emitted light. On the other hand, the thickness of the high concentration layer should be more than 0 to obtain the effect of this invention.

Impurity (or carrier) concentration in the high concentration layer is required to be approx. 1.5 times or more of that in the region in which the layer is formed. In case of less impurity concentration, the effect due to the formation of the layer is not remarkable. In this connection, one conductivity type region in which recombination radiation is to occur is required to be degenerated, as has been broadly known, in case of a semiconductor laser. In other words, the region mentioned should have an impurity concentration of 5 to 7 $\times 10^{17}$ cm.$^{-3}$ or more in order to provide a laser. Accordingly, a semi-conductor laser according to this invention is made, to say in other words, by leaving such a portion of the degenerated region that is situated adjacent to the p-n junction within the diffusion length of carrier, and by lowering the impurity concentration of the other portion of the degenerated region down to 1/1.5 or less of that of the left portion or of the initial concentration. Such a degeneration of the light-emitting region is not necessary for normal light-emitting devices other than lasers.

According to the present invention, a light output of a sufficiently large degree can be obtained also in the direction perpendicular to the junction even through one conductivity type light-emitting region, for example, through the p-type region in case of gallium arsenide being used.

Furthermore, a large output can be obtained by utilizing the reflection on the crystal surface substantially parallel to the junction in case of light-emitting diodes, according to the present invention.

The above and other features and advantages of the present invention will be apparent from the following description of preferred embodiments of the invention as illustrated in the drawings, wherein:

FIGS. 1(*a*) to 1(*e*) inclusive are perspective views of an embodiment of this invention, in various steps in the manufacture;

Figure 1:
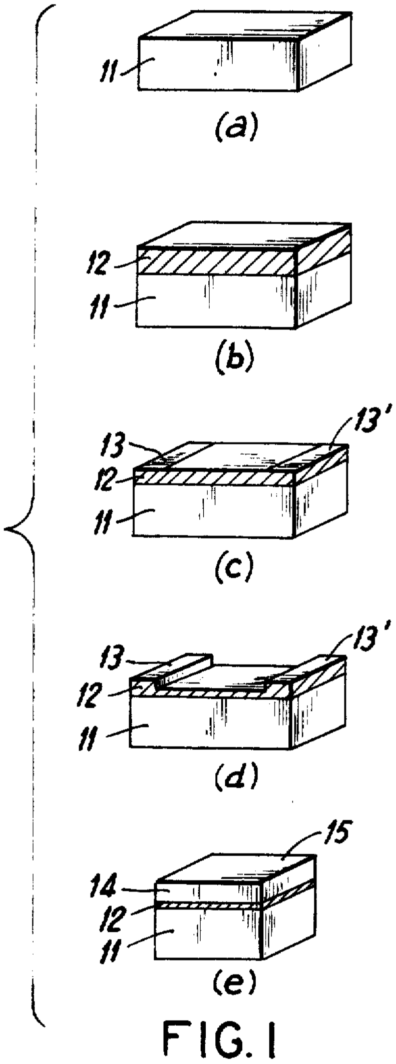

FIG. 1(*a*) shows a single crystal substrate 11 of n-type gallium arsenide containing tellurium of 2 $\times 10^{18}$ atoms/cm.$^3$ and of approx. 300 microns thick. Over this substrate 11, a layer (not shown) of $p^+$-type (high concentration p-type) gallium arsenide single crystal is grown to the thickness of approx. 100 microns by means of the well-known solution grown method of about 70 minutes' duration at the maximum temperature of approx. 900° C. using a solution containing 4.5 g. of gallium, 0.03 g. of zinc and 0.7 g. of gallium arsenide. The details of the solution grown method is described in "RCA Review," December 1963, pp. 603–615. The grown layer of carrier concentration of approximately 8 $\times 10^{18}$ cm.$^{-3}$ is thus obtained. Then, the substrate covered with the grown layer is polished to provide a taper of 5 degrees and next immersed in a mixed solution containing nitric acid and fluoric acid in the ratio of 1:1 in volume for about one second to expose the p-n junction at the tapered portion. Thereafter, the $p^+$-type layer is completely removed from the surfaces of the substrate by abrasives, except for the layer 12 covering one surface. The resultant crystal is shown in FIG. 1(*b*).

Next, the retained $p^+$-type layer 12 is polished to the thickness of approximately 10 microns so as to have a mirror surface. Then, layers 13 and 13' of nickel of approx. 200 microns in width are deposited by non-electrolytic plating, at both ends of the mirror-polished surface of the $p^+$-type layer 12, as shown in FIG. 1(*c*). The crystal is then subjected to electrolytic polishing in an aqueous solution of 8% caustic potash with the nickel layers 13 and 13' being used as electrodes, to make the $p^+$-type layer 12 thinner. In this process, the thickness of the $p^+$-type layer 12 is measured indirectly by making flow an electric current between the electrodes 13 and 13' and by observing the change of resistance of the layer by an oscilloscope or the like. Where the $p^+$-type layer 12 of initially 10 microns in thickness is intended to be brought to the thickness of, for example, 1 micron, the electrolytic polishing is continued until the resistance of the layer 12 becomes ten times as much as it was before the polishing. For instance, where the dimensions of the $p^+$-type layer 12 are 1 cm. in length, 5 mm. in width and 10 microns in thickness, the layer 12 has the resistance of approx. 5 ohms. When the thickness of the layer 12 is decreased to 1 micron, the resistance becomes 50 ohms. The structure thus obtained is shown in FIG. 1(*d*). Next steps are to remove the electrodes 13 and 13' and to grow a layer 14 of p-type gallium arsenide single crystal of carrier concentration of $7\times10^{17}$ cm.$^{-3}$ to a thickness of approx. 100 microns by the solution grown method of 70 minutes' duration at the maximum temperature of 900° C. using a solution containing 4.5 g. of gallium, 0.01 g. of zinc and 0.7 g. of gallium arsenide. Thus, the crystal having the p-$p^+$-n structure as shown in FIG. 1(*e*) is obtained.

Naturally, the n-type substrate 11 of FIG. 1(*a*) may be replaced by a $p^+$-type gallium arsenide single crystal having a high carrier concentration. In this case, an n-type single crystal layer is grown on the $p^+$-type substrate by the solution grown method using a solution containing 4.5 g. of gallium, 0.01 g. of tellurium and 0.7 g. of gallium arsenide, to obtain the $p^+$-n structure. By the subsequent steps same as described with reference to FIGS. 1(*c*) to 1(*e*), the similar p-$p^+$-n structure is obtained. It is needless to say that the well-known epitaxial growth method may be employed instead of the above solution grown method in depositing the two single crystal layers in separate steps. Furthermore, the control of the thickness of the $p^+$-type layer can be sufficiently effected by various chemical polishing methods other than electrolytic polishing.

Figure 2:
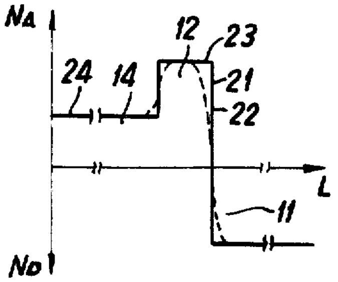
FIG. 2 is a graph of impurity concentration distribution in the embodiment.

FIG. 2 shows the impurity concentration distribution in the crystal of FIG. 1(*e*) in a schematic manner. The abscissa represents the length L from the upper surface 15 of the crystal of FIG. 1(*e*), while the ordinate represents the impurity concentration of the crystal. The upper half of the ordinate above the abscissa represents the acceptor concentration $N_A$ (concentration of zinc in case of the crystal of FIG. 1), while the lower half the donor concentration $N_D$ (concentration of tellurium in case of FIG. 1). The distribution diagram of the full line 21 shows schematically the resultant impurity concentration distribution in the crystal described above. In practice, however, the distribution becomes as shown by the dotted line 22, because the impurities diffuse outward during the growth of the crystal layers. Accordingly, the boundary lines between the $p^+$-type layer 12 of 1 micron thick and the p-type layer 14 and between the $p^+$-type and n-type layers 12 and 11 are not steep. In this specification, the effective thickness of the $p^+$-type layer is defined as the distance between the p-n junction and the position at which the concentration is just the intermediate value of the highest concentration 23 and the concentration 24 of the p-type layer 14. In the crystal of FIG. 1(*e*), the $p^+$-type layer is of 1 micron thick. Even if the actual thickness of the $p^+$ layer is selected at the order of 2 microns in the step of FIG. 1(*d*), the effective thickness thereof can well be made 1 micron or less by heating in the step of deposition of the crystal layer.

In the crystal of FIG. 1(*e*), when forward-biased, electrons injected from the junction into the p-type region cause the recombination radiation within the $p^+$-type layer 12 whose thickness is substantially equal to the diffusion length of electron. Since the hole concentration is high in the $p^+$ layer 12, light emission is strong. While, the impurity concentration is low in the adjacent p region 14, with the result that the absorption of the emitted light is less in this region. Also, the light absorption in the adjacent n-type region 11 is less, because the impurity concentration in this region is $2\times10^{18}$ cm.$^{-3}$. Consequently, the light generated in the $p^+$ layer 12 can emerge out without being subjected to much light absorption.

Figure 3:
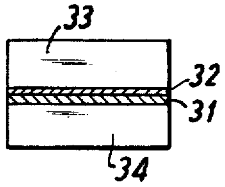
FIG. 3 is a side view of another embodiment of this invention.

FIG. 3 is the side view of another embodiment of the present invention in which the $n^+$-type layer 31 is further added to the structure of FIG. 1(*e*) in order to enhance the injection efficiency. There are many methods for realizing such structure. One example is that the $p^+$-type layer 32 and p-type layer 33 are grown in the same manner as described with reference to FIG. 1(*a*) to FIG. 1(*e*) on an $n^+$-type (high concentration n-type) gallium arsenide substrate 31 containing $8\times10^{18}$ atoms/cm.$^3$ of tellurium. Thereafter, the substrate 31 is polished to the thickness of approx. 5 microns by the same method as described with reference to FIG. 1(*c*) and (*d*), and then an n-type layer 34 containing $5\times10^{17}$ cm.$^{-3}$ of tellurium is grown thereon in the same manner as described with reference to FIG. 1(*a*) and (*b*) by using the solution containing 4.5 g. of gallium, 0.01 g. of tellurium and 0.7 g. of gallium arsenide.

In this structure, when electric current is passed in the forward direction, the injection efficiency from the $n^+$ layer 31 into the $p^+$ layer 32 increases and hence the light emission due to recombination radiation in the $p^+$ layer 32 is further augmented. Although the absorption in the $n^+$ layer 31 to the light generated in the $p^+$ layer 32 is essentially not so great, it is favorable to make the thickness of the $n^+$ layer 31 as thin as possible in order to limit this light absorption to the minimum. In this example, thickness is made 5 microns. The light absorption in the p layer 33 and in the n layer 34 is small, as described above. After all, the structure of FIG. 3 will serve to to attain further effectivenes of the present invention.

Figure 4:
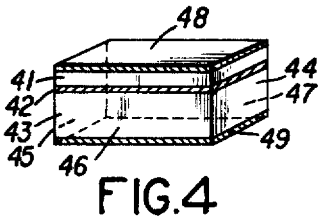
FIG. 4 is a perspective view of an example of laser diodes according to this invention.

FIG. 4 illustrates a laser diode which is the most preferable embodiment of this invention. This is the gallium arsenide laser diode of p-$p^+$-n structure consisting of p-type region 41, $p^+$-type layer 42 and n-type region 43. The thickness and impurity concentration of each region or layer are the same as those of the layers 11, 12 and 14 of FIG. 1(*e*). The opposing faces 44 and 45 are cleaved or machine-polished so as to provide parallel, smooth mirror faces and constitute a Fabry-Pérot type resonator. The other pair of opposing faces 46 and 47 are rough-finished. On the upper and lower faces, nickel is deposited by nonelectrolytic plating and sintered to provide electrodes 48 and 49.

When electric current is passed in the forward direction between the electrodes 48 and 49 at liquid nitrogen temperature, laser oscillation occurs at a current density higher than a certain threshold value. A typical example with the laser diode of FIG. 4 will be given in the following. Where the length of the resonator (or the distance between the faces 44 and 45) was 150 microns, the threshold current density was approx. 2,000 A./cm.$^{-2}$ and the oscillation wavelength was 8,490 angstroms. On the other hand, with the conventional $p^+$-n structure laser diode made by the solution grown process in which dimensions of crystal and impurity concentrations of n-type substrate and $p^+$-type region are all same as in the diode of this invention, a typical example under the same conditions was that the threshold current density was approx. 5,000 A./cm.$^2$ and the oscillation wavelength was 8,470 angstroms. It is thus proved that the laser diode of this invention has a less light absorption loss.

Figure 5:
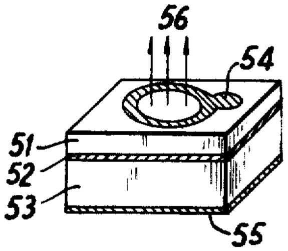
FIG. 5 is a perspective view of an example of light-emitting diodes according to this invention.

FIG. 5 shows a light-emitting diode according to the present invention, in which the light is emitted from the p-type region side. The thickness and the impurity concentration in each region or layer of the p-$p^+$-n structure are same as those in the structure of FIG. 1(*e*). That is, the p region 51, the $p^+$ layer 52 and the n region 53 correspond respectively to the layers 14, 12 and 11 of FIG. 1(*e*).

In the conventional light-emitting elements of this type, there is no other countermeasure except for making the p region extremely thin, for the purpose of avoiding the large light absorption in the p-type region. However, according to this invention, the p-type region 51 absorbs less light generated from the $p^+$ layer 52, so that sufficiently strong light output can be obtained without making the junction forcibly shallow. The upper electrode 54 and the lower counterelectrode 55 are formed by sintering the nonelectrolytically plated nickel. When current is passed in the forward direction between these electrodes, the light output 56 in the direction perpendicular to the junction can be detected through the p-type region 51.

Figure 6:
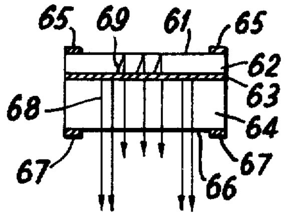
FIG. 6 is a longitudinal cross sectional view of another example of the light-emitting diodes according to this invention.

FIG. 6 shows another light-emitting diode, in which the reflecting surface 61 is utilized to increase the efficiency of the light running out through the n region. The p-type region 62, the $p^+$-type layer 63 and the n-type region 64 correspond respectively to the layers 14, 12 and 11 of FIG. 1(*e*). The reflecting surface 61 is produced by polishing it into mirror face or further plating with silver. The nickel electrode 65 is provided on a part of the surface 61 by the same process as described above, and on a part of the lower mirror surface 66 the counterelectrode 67 is disposed. When electric current is passed in the forward direction between the electrodes 65 and 67, the light 68 which is generated in the $p^+$ layer 63 and directed downwards passes through the n region and emerges out of the element, while the light 69 directed upwards passes through the p region 62 and is reflected by the reflecting surface 61 and again passes through the p region 62, the $p^+$ layer 63 and the n region 64. However, as described before, the p region 62 and the n region 64 absorb only a little of the light generated from the $p^+$ layer 63. Also, the $p^+$ layer 63 scarcely absorbs the reflected light, because the $p^+$ layer 63 is wholly within the light-emitting zone and because its thickness is small. Therefore, the light emitted from the n region has the intensity approximately twice as much as with the conventional light-emitting element in which the light is emitted from the n region side and in which the p region absorbs much light. For example, as compared with the conventional light-emitting element in which dimensions and impurity concentrations of $p^+$ layer and n region are the same as those of the $p^+$ layer 63 and the n region 64 of FIG. 6 and in which the light is emitted from the n region side, the light-emitting element having the silver-coated reflecting surface of this invention as shown in FIG. 6 has the light output approximately 1.8 times.

It is clearly understood that the light-emitting diode of FIG. 6, even if the lower surface 66 is silver-plated to provide a reflecting surface and the light is emitted from the upper surface 61, attains the same efficiency as described above, that is, has the light output approximately twice as much as that of the conventional light-emitting diode.

Furthermore, in the device of FIG. 5, it is apparent that if the electrode 55 is provided on a portion of the lower surface in the same manner as in the electrode 67 of FIG. 6 and the lower surface is made to be a mirror face in order that the light is emerged therefrom, the light beams of nearly equal intensity can be emitted in both directions through the p-type region 51 and the n-type region 53.

Some preferable embodiments of this invention have been described in the foregoing, but it should be understood that this invention is not limited to those embodiments. In the embodiments of FIGS. 4, 5 and 6, only the p-$p^+$-n structure was described in accordance with the principle explained with reference to FIG. 1. But it will be apparent that the p-$p^+$-$n^+$-n structure explained in FIG. 3 may be used as a substitute. It is needless to say that in the light-emitting elements or lasers in which the light emission occurs in the n-type region, the structure is replaced by n-$n^+$-p or n-$n^+$-$p^+$-p structure. Also, it will become possible to make a plurality of the above-described elements within one pellet by utilizing the selective growth and the selective diffusion, in accordance with technical advances. Further, it is naturally possible that instead of gallium arsenide used as a semiconductor material in the above-mentioned embodiments, any semiconductor of direct-transition type can be used and that any impurities which determine the conductivity types can be selected according to the semiconductors to be used.

What is claimed is:

1. A light-emitting semiconductor device comprising a semiconductor crystal of direct-transition type having a first region of one conductivity type and a second region of an opposite conductivity type to said one conductivity type separated from said first region by a p-n junction, recombination radiation of carrier occurring in said first region in the vicinity of the junction with a forward bias being applied across the junction, characterized in that in said first region a layer of the same conductivity type but of a higher impurity concentration is formed adjacent to said p-n junction, said layer having a thickness not greater than the diffusion length of the carrier injected from said junction.

2. The light-emitting semiconductor device according to claim 1, wherein the impurity concentration of said layer is not less than 1.5 times of that of said first region.

3. A semiconductor laser comprising a semiconductor crystal of direct-transition type having a first region of one conductivity type and a second region of an opposite conductivity type separated from said first region by a p-n junction, recombination radiation of carrier occurring in said first region in the vicinity of said junction with a forward bias being applied across said junction, characterized in that in said first region a degenerated layer of the same conductivity type is formed adjacent to said p n junction, said layer having a thickness not greater than the diffusion length of the carrier injected from said junction and that the impurity concentration of the remaining portion of said first region is not more than 1/1.5 of that of said layer.

References Cited

UNITED STATES PATENTS

| | | | |
|---|---|---|---|
| 3,245,002 | 4/1966 | Hall | 331—94.5 |
| 3,305,685 | 2/1967 | Wang | 250—199 |
| 3,293,513 | 12/1966 | Biard et al. | 317—237 |
| 3,330,991 | 7/1967 | Lavine et al. | 315—94 |

OTHER REFERENCES

Norwood and Hutchinson: "Diffusion Lengths in Epitaxial GaAs by Angle Lapped Junction Methods," Solid State Electronics, 1965, vol. 8, pp. 807–811.

JOHN W. HUCKERT, Primary Examiner

B. ESTRIN, Assistant Examiner

U.S. Cl. X.R.

250—211; 313—108; 317—235; 331—94.5